(12) United States Patent
Cho

(10) Patent No.: US 7,619,927 B2
(45) Date of Patent: Nov. 17, 2009

(54) NON-VOLATILE MEMORY DEVICE AND METHOD FOR FABRICATING THE SAME

(75) Inventor: Yang-Ho Cho, Ichon-shi (KR)

(73) Assignee: Hynix Semiconductor Inc., Ichon-shi, Kyoungki-do (KR)

( * ) Notice: Subject to any disclaimer, the term of this patent is extended or adjusted under 35 U.S.C. 154(b) by 67 days.

(21) Appl. No.: 11/770,830

(22) Filed: Jun. 29, 2007

(65) Prior Publication Data
US 2008/0239814 A1 Oct. 2, 2008

(30) Foreign Application Priority Data
Mar. 31, 2007 (KR) .................. 10-2007-0032087

(51) Int. Cl.
*G11C 16/06* (2006.01)
(52) U.S. Cl. .............. 365/185.17; 365/185.11; 365/185.05; 365/185.14; 365/185.26
(58) Field of Classification Search ............ 365/185.17, 365/185.11, 185.05, 185.14, 185.26
See application file for complete search history.

(56) References Cited

U.S. PATENT DOCUMENTS

2005/0173751 A1* 8/2005 Ishii et al. ............ 257/314
2006/0118855 A1 6/2006 Lee et al.
2006/0289938 A1* 12/2006 Kim ..................... 257/365
2006/0292802 A1* 12/2006 Lee et al. ............... 257/314
2008/0163028 A1* 7/2008 Mokhlesi ................ 714/763

FOREIGN PATENT DOCUMENTS

| JP | 2003-197779 | 7/2003 |
| KR | 1020040028384 | 4/2004 |
| KR | 1020040060549 | 7/2004 |

OTHER PUBLICATIONS

Korean Notice of Allowance for Korean application No. 10-2007-0032087.

* cited by examiner

*Primary Examiner*—Thong Q Le
(74) *Attorney, Agent, or Firm*—Lowe Hauptman Ham & Berner, LLP

(57) ABSTRACT

A non-volatile memory device includes a plurality of memory cells coupled in series, a plurality of word lines coupled to the respective memory cells, and a plurality of spacers interposed between the word lines and having different dielectric constants according to line widths of the word lines.

22 Claims, 11 Drawing Sheets
(1 of 11 Drawing Sheet(s) Filed in Color)

NON-VOLATILE MEMORY DEVICE AND METHOD FOR FABRICATING THE SAME

CROSS-REFERENCE TO RELATED APPLICATIONS

The present invention claims priority of Korean patent application number 10-2007-0032087, filed on Mar. 31, 2007, which is incorporated by reference in its entirety.

BACKGROUND OF THE INVENTION

The present invention relates to a memory device and a method for fabricating the same, and more particularly, to a non-volatile memory device and a method for fabricating the same.

Presently, among various non-volatile memory devices, NAND flash memory devices are widely used. In the memory devices, a plurality of memory cells that are coupled to each other in series configure to form a unit string, NAND flash memory devices are applied for high integration and can replace memory sticks, universal serial bus drivers (USBs), and hard disks.

Generally, in a NAND flash memory device, a plurality of memory cells for data storage (e.g., 16, 32, or 64 memory cells), a drain selection transistor that couples a drain of the first memory cell to a bit line, a source selection transistor that couples a source of the last memory cell to a common source line are coupled to each other in series to form one unit string.

FIG. 1 illustrates a circuit diagram of a memory cell array of a conventional NAND flash memory device. In this example, a string structure including 32 memory cells is illustrated.

The conventional NAND flash memory device includes a plurality of memory blocks, and a plurality of strings ST are placed in each of the memory blocks. Each of the strings ST includes a drain selection transistor, a source selection transistor, and a plurality of memory cells that are serially coupled together between the drain selection transistor and the source selection transistor. A source of the source selection transistor in each of the strings ST is coupled to a common source line. A gate of the drain selection transistor in each of the strings ST is coupled to a drain selection line DSL, and a gate of the source selection transistor in each of the strings ST is coupled to a source selection line SSL. Control gates of the memory cells are coupled to respective word lines WL0 to WL31. Reference denotations BL0 to BLn represents a plurality of bit lines prepared in n numbers, where n is a natural number.

As illustrated, since the memory cells in the NAND flash memory device are serially coupled together to form the unit string, the NAND flash memory device is prone to interference between neighboring peripheral memory cells. Thus, the state of the memory cells that configure the unit string (i.e., the threshold voltage) needs to be maintained consistent for reliable operation of the device and to further improve yields.

An interference effect refers to an incidence in which a threshold voltage of a selected memory cell changes due to an operation of a peripheral memory cell adjacent to the selected memory cell, particularly, a programming operation in relation to data storage. When a programming operation is performed for a second memory cell adjacent to a first memory cell selected to read data, capacitance between the first memory cell and the second memory cell changes due to electrons injected into a floating gate of the second memory cell. Further, when the first memory cell is read, the change in capacitance causes occasional reading of a voltage higher than the threshold voltage of the first memory cell. Although an amount of charges injected into the floating gate of the selected memory cell does not change, the threshold voltage of the selected memory cell is distorted due to the state change of the neighboring memory cell.

A threshold voltage of a memory cell for each word line within a string (a cell threshold voltage), after the programming operation, changes at least because of the interference effect. In particular, the word line WL0 illustrated in FIG. 1 is fabricated to have a larger line width in a horizontal direction and a wider space than the other word lines WL1 to WL31 for improving program disturbance with the neighboring source selection transistor. Depending on the need, even in the case where an etching is performed using an etch mask having the width as same as the word lines WL0 to WL31, the word line WL0 is formed to have a larger width than the other word lines WL1 to WL30 according to the pattern density of the word lines WL0 to WL31. Thus, under the same condition, the word line WL0 usually has a voltage higher than a program threshold voltage of the other word lines WL1 to WL31.

FIG. 2 illustrates a graph of cell threshold voltage distribution for each word line. The threshold voltage of each of the memory cells within the same string is measured after the performance of a programming operation for the same string under the same condition. In this graph, the cell threshold voltage Cell $V_T$ is expressed in a horizontal X axis, and the number of the memory cells is expressed in a vertical Y axis.

Even if the program operation is performed for the same string under the same condition, the threshold voltage of the memory cell coupled to a word line WL0, adjacent to a source selection transistor, is relatively higher than the threshold voltages of the memory cells respectively coupled to the word lines WL1 to WL30. The threshold voltage of the memory cell coupled to the word line WL31 is low.

The above-described result is caused due to the interference effect. Thus, it is necessary to secure uniformity in the cell threshold voltage for each word line within the same string in order to improve reliability of devices. Further, it is to be understood that the afore-mentioned limitation is not only for the conventional NAND flash memory device, but also for many types of memory devices configured with the string structure.

SUMMARY OF THE INVENTION

The present invention contemplates a non-volatile memory device, which can maintain uniformity in a threshold voltage of memory cells within the same string so as to improve reliability of devices.

The present invention is also directed to a method for fabricating the non-volatile memory device.

In accordance with one aspect of the present invention, there is provided a non-volatile memory device, which includes a plurality of memory cells coupled in series, a plurality of word lines coupled to the respective memory cells, and a plurality of spacers interposed between the word lines and having different dielectric constants according to line widths of the word lines.

In accordance with another aspect of the present invention, there is provided a non-volatile memory device, which includes a bit line, a common source line, a first selection transistor coupled to the bit line, a second selection transistor coupled to the common source line, a plurality of memory cells coupled in series between the first selection transistor and the second selection transistor, a plurality of word lines coupled to the respective memory cells, and a plurality of spacers interposed between the word lines and having different dielectric constants according to line widths of the word lines.

In accordance with another aspect of the present invention, there is provided a method for fabricating a non-volatile memory device, wherein the non-volatile memory device is configured in a unit string including first and second selection transistors, and a plurality of memory cells coupled in series between the first and second selection transistors. The method includes forming the first and second selection transistors and the memory cells over a substrate, forming first spacers to fill spaces between the memory cells, removing one of the first spacers formed between the memory cell coupled to one of the first and second selection transistors and the neighboring memory cell, and forming a second spacer to fill a removal portion of the first spacers, the second spacer comprising a material having a lower dielectric constant than a material for the first spacers.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DESCRIPTION OF SPECIFIC EMBODIMENTS

Prior to describing embodiments of the present invention, a programming operation of a NAND flash memory device will be described briefly. The programming operation employs a sequential programming operation mode.

According to the sequential programming operation mode, a programming operation is sequentially performed per page unit, i.e., per word line. For instance, the programming operation is sequentially performed for memory cells coupled to respective word lines numbered from 0 to n, where n is a natural number (e.g., n becomes 31 if 32 strings exist).

When the programming operation is performed for such a memory cell coupled to the nth word line, the memory cell coupled to the n−1th word line (i.e., the memory cell completed with the programming operation) has a threshold voltage whose voltage level increases due to the interference effect caused by the memory cell coupled to the nth word line.

Figure 3:
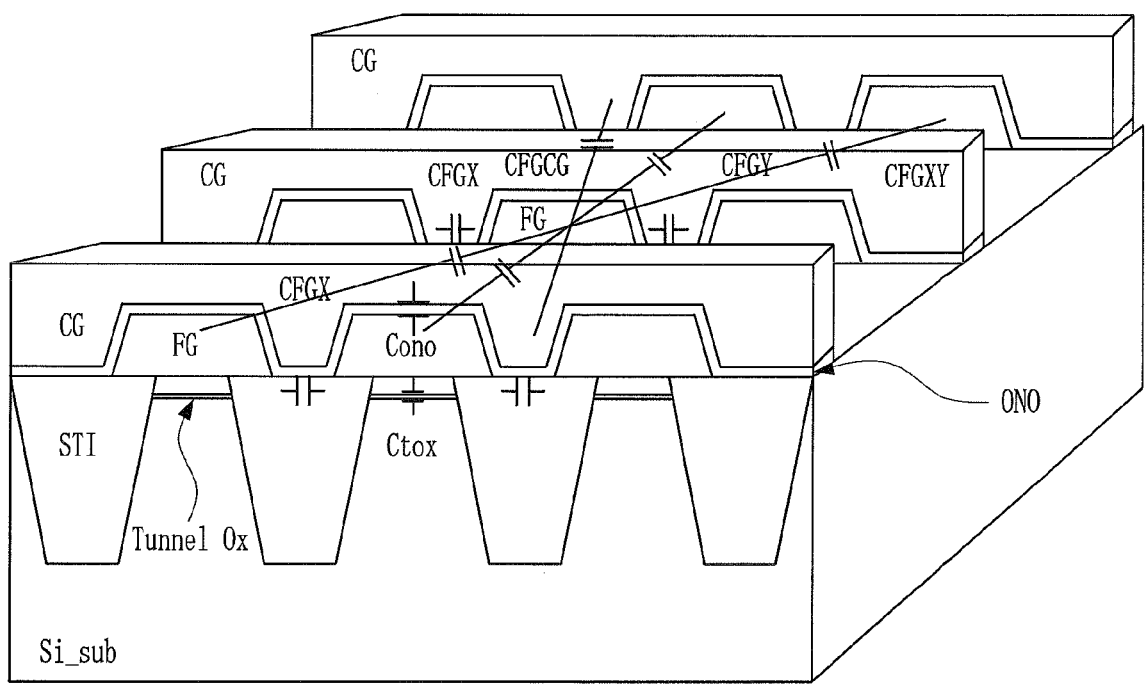
FIG. 3 illustrates a lateral perspective view of a part of the memory cell array illustrated in FIG. 1.
Figure 4:
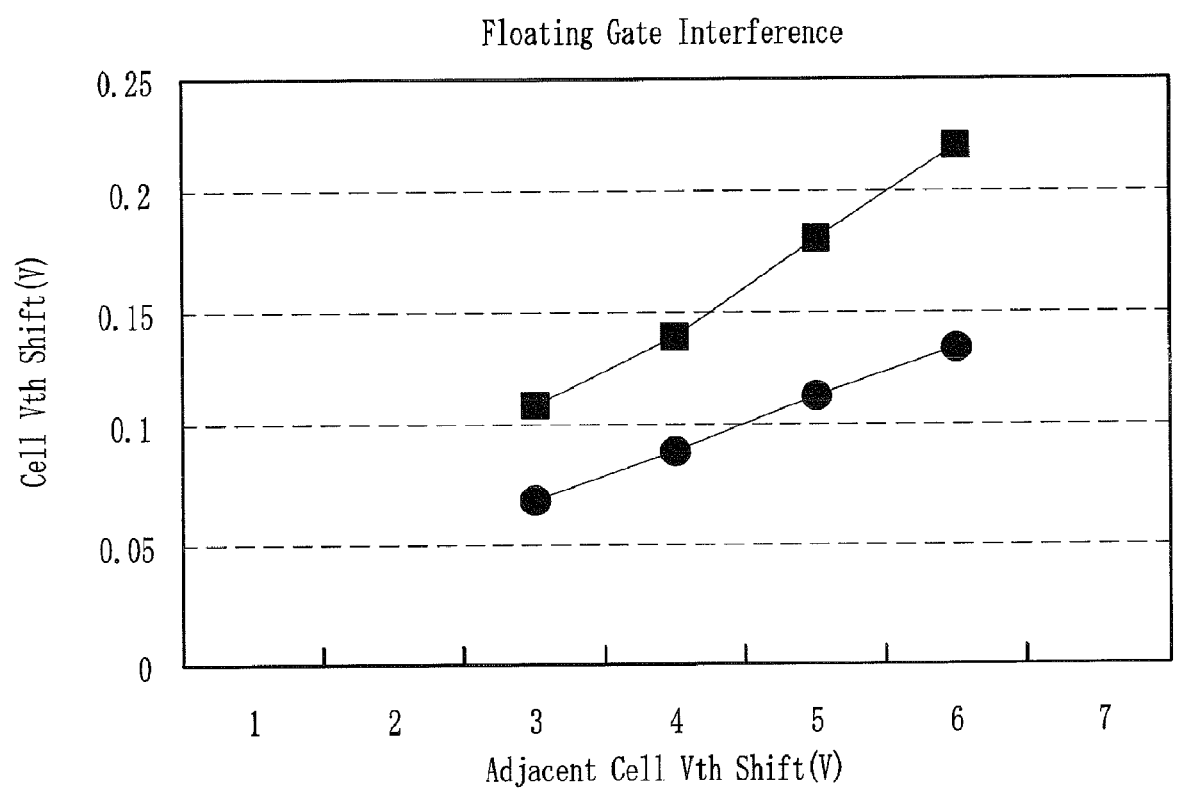
FIG. 4 illustrates a graph of cell threshold voltages that are shifted because of an interference effect occurring due to a material existing between adjacent floating gates in the memory cell array illustrated in FIG. 1.

With reference to FIGS. 3 and 4, detailed description of the threshold voltage increase will be provided. FIG. 3 illustrates a lateral perspective view of a part of a memory cell array of a NAND flash memory device. FIG. 4 illustrates a graph of shifted threshold voltages of adjacent memory cells, because of an interference effect occurring in adjacent floating gates.

In FIG. 3, reference labels 'Si-Sub,' 'STI,' 'Tunnel Ox,' 'FG,' 'ONO,' and 'CG,' represent a substrate, an isolation structure, a tunnel oxide layer, a floating gate, a dielectric layer, and a control gate, respectively. Also, 'Ctox' represents capacitance between the substrate Si-Sub and the floating gate FG. Reference labels 'CFGX,' 'CFGY,' and 'CFGXY,' represent capacitance between the floating gates FG adjacent in an X-axis direction, capacitance between the floating gates FG adjacent in an Y-axis direction, and capacitance between the floating gates FG in the X-axis and Y-axis directions.

As illustrated in FIG. 3, the memory cell array of the NAND flash memory device includes insulation layers for spacers interposed between word lines (i.e., the control gates CG). Since the insulation layers function as dielectric layers, capacitance between the word lines, particularly, between the floating gates FG is generated. Due to the capacitance, an interference effect occurs in between the adjacent floating gates FG, resulting in a shift/change in the cell threshold voltage.

Figure 1:
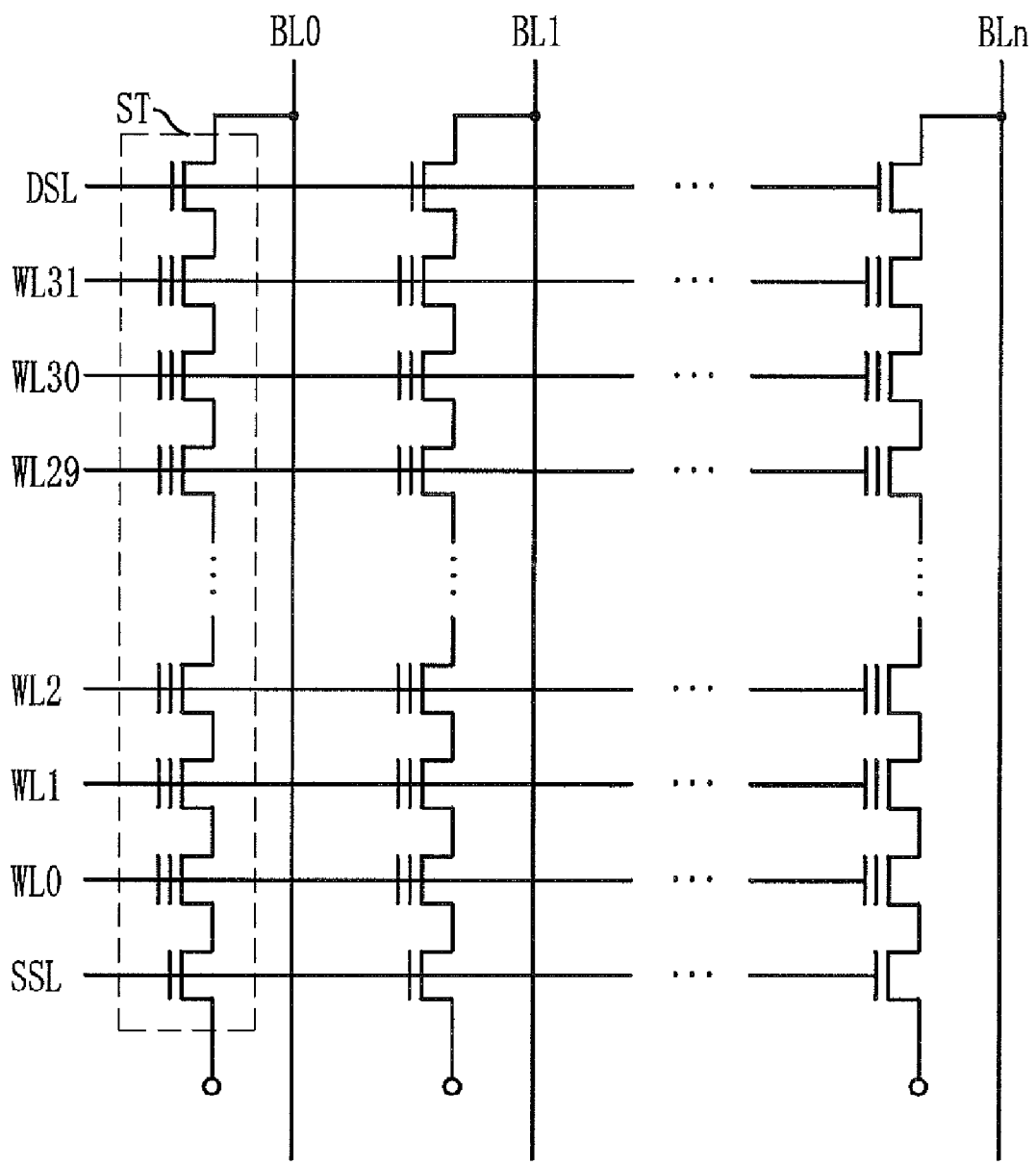
FIG. 1 illustrates a circuit diagram of a memory cell array of a conventional NAND flash memory device.
Figure 2:
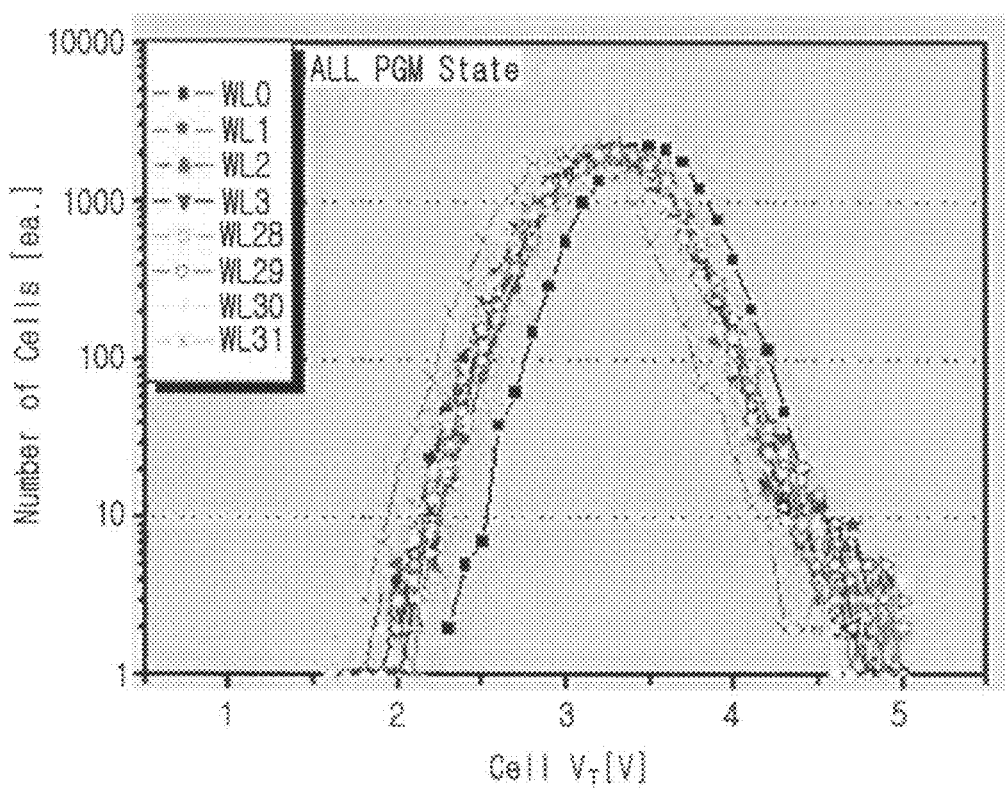
FIG. 2 illustrates a graph of cell threshold voltage distribution for each word line within a string illustrated in FIG. 1.

Further, as illustrated in FIG. 2, for the purpose of better understanding, it is considered that in the memory cell array including the unit string ST configured with the 32 word lines WL0 to WL31 that the word lines WL1 to WL31 have substantially the same line width, and the word line WL0 have the line width larger than the rest word lines WL1 to WL31. It is also considered that the spacer insulation layers interposed between the word lines WL0 to WL31 include substantially the same material. In addition, for example, an incremental fraction of the threshold voltage caused by the interference effect is approximately 0.5 V.

For the above-described memory cell array structure, if the programming operation is performed from the last word line WL31 to the first word line WL0 based on the sequential programming operation mode, considering that the memory cell coupled to the word line WL31 completed with the first programming operation has a threshold voltage of approximately 2 V, the memory cells respectively coupled to the rest word lines WL30 to WL1 have a threshold voltage increased to approximately 2.5 V due to the interference effect. However, the memory cell coupled to the word line WL0 completed with the last programming operation has a threshold voltage greater than or equal to at least 2.5 V, because the line width of the word line WL0 is larger than the line widths of the word lines WL1 to WL30. In other words, the enlarged line width of the word line indicates that the line width of the floating gate that stores data is also large due to the application of the same patterning. Thus, more electrons are injected into the floating gate under the same biased condition, thereby increasing the cell threshold voltage in proportion to the injected electron amounts.

The cell threshold voltage shift/change in the memory cells caused by the interference effect between the adjacent floating gates can be controlled by a material used for forming the insulation layers between the floating gates. This control is acceptable, because materials have dielectric constants that are unique but different from each other depending on material properties.

For instance, FIG. 4 illustrates the comparative case where the insulation layers formed between the floating gates include an oxide-based material or a nitride-based material. The nitride-based material having a high dielectric constant affects the cell threshold voltage more than the oxide-based material. This result is because higher dielectric constant induces larger capacitance.

This result indicates that the interference increases in proportion to the capacitance. The capacitance can be defined as the following mathematical equation.

$$C = eS/d \qquad \text{Eq. 1}$$

In this equation, 'C,' 'e,' 'S,' and 'd,' represent the capacitance, a dielectric constant of an insulation material, an area, and a thickness of the insulation material, respectively.

Applying the above-defined mathematical equation 1 for the calculation of the capacitance between the two word lines CG in the memory cell array structure illustrated in FIG. 3, 'C,' 'e,' 'S,' and 'd' are indicative of the capacitance between the two adjacent word lines CG, the unique dielectric constant of the insulation material between the two word lines CG, the area of each of the word lines CG, and the distance between the two word lines CG, respectively.

Accordingly, adjusting the areas of the word lines, the distance therebetween, and the dielectric constant of the insulation material existing between the word lines, allow the control of the capacitance between the two word lines. However, the areas of the word lines and the distance between the word lines are important factors that determine the chip size in fabricating semiconductor devices. Thus, increasing or decreasing the areas of the word lines and the distance therebetween may be limited.

Accordingly, various embodiments of the present invention are provided to show a method of controlling the cell threshold voltage by controlling the interference effect. The interference control can be achieved by adjusting the dielectric constant of the insulation material instead of adjusting the areas and the distance. If one of the word lines has the width larger than the other word lines, an insulation layer (i.e., spacer) interposed between the word lines one of which has relatively the large width, includes a material whose dielectric constant is lower than a material for an insulation layer interposed between the word lines having relatively small widths. If the distance between the two word lines is larger than the distance between the other two word lines, an insulation layer (i.e., spacer) interposed between the two word lines spaced widely includes a material whose dielectric constant is higher than a material for an insulation layer interposed between the word lines spaced narrowly. Through these adjustments, it is possible to secure substantially the same threshold voltage within the same unit string.

Figure 5:
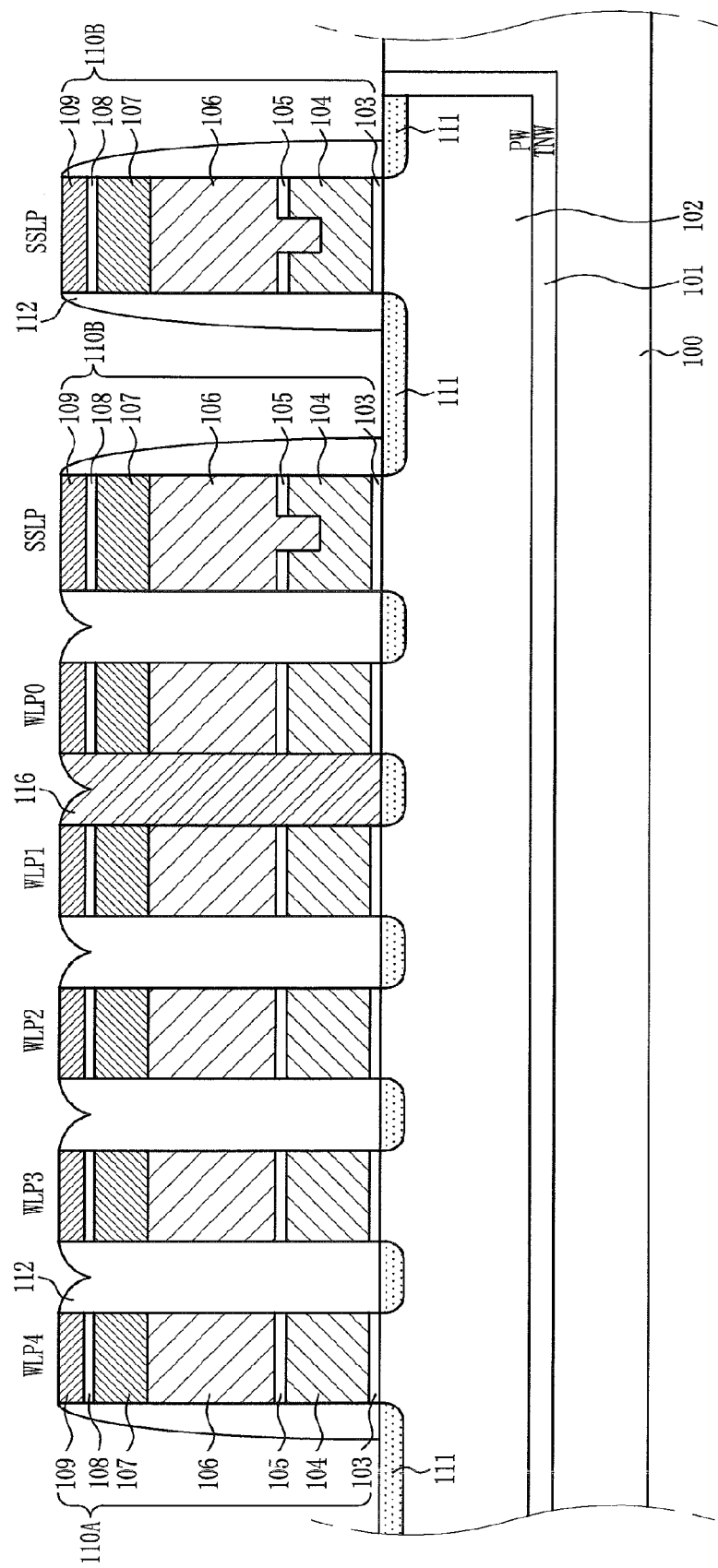
FIG. 5 illustrates a cross-sectional view of a NAND flash memory device in accordance with an embodiment of the present invention.

Detailed description of such embodiments of the present invention will be provided herein below. FIG. 5 illustrates a cross-sectional view of a NAND flash memory device in accordance with a first embodiment of the present invention. For simplicity of the description, source selection lines SSLP and 5 word lines WLP0 to WLP4 among 32 memory cells that configure a unit string are illustrated.

In FIG. 5, reference numerals 100, 101, and 102 represent a P-type substrate, a triple N-type well labeled as TNW, and a P-type well labeled as PW, respectively. Reference numerals 110A and 110B represent respective first and second gate structures, each including a gate insulation layer 103, a floating gate 104, a dielectric layer 105, and a control gate 106. Reference numerals 107, 108, and 109 represent a metal layer, a buffer layer for protecting the metal layer 107 and a hard mask, respectively. Reference denotation 'SSLP' represents a source selection line SSLP, and reference numeral 111 represents a junction region functioning as a source or drain region. Detailed description of the mentioned elements will be provided with reference to FIGS. 6A to 6D.

Referring to the individual cell threshold voltages illustrated in FIG. 2, the first embodiment of the present invention suggests a structure configured to lower a threshold voltage of a memory cell coupled to a word line adjacent to a drain selection transistor to a voltage level substantially the same as that of a threshold voltage of a group of memory cells coupled to respective other word lines.

Referring to FIG. 5, in the NAND flash memory device according to the first embodiment of the present invention, an insulation layer interposed between a word line WLP0 and another WLP1 and insulation layers interposed individually between other word lines WLP1 to WLP31 include materials having different dielectric constants. The insulation layers are used for the insulation between gates, and are generally called spacers. For instance, the insulation layer interposed between the word lines WLP0 and the other word line WLP1 includes a material having a lower dielectric constant than a material for forming the insulation layers interposed between the other word lines WLP1 to WLP31.

In the case of using such a material having a lower dielectric constant for the insulation layer interposed between the word line WLP0 and the other word line WLP1 compared to the material for the insulation layers interposed between the other word lines WLP1 to WLP31, the capacitance generated by the insulation layer interposed between the word line WLP0 and the other word line WLP1 is more reduced than the capacitance generated by the insulation layers interposed between the other word lines WLP1 to WLP31. As a result, a threshold voltage of a memory cell coupled to the word line WLP0 can be reduced.

Accordingly, with respect to the threshold voltage distribution within the same unit string as illustrated in FIG. 2, the threshold voltage of the memory cell coupled to the word line WLP0 can be reduced to a voltage level substantially the same as those of the threshold voltages of the memory cells coupled to the respective word lines WLP1 to WLP30. Thus, it is possible to obtain uniformity in the cell threshold voltage within the same unit string.

Regarding the insulation materials, if a nitride-based material such as $Si_3N_4$ whose dielectric constant is approximately 7.8 is used as the insulation material for the word lines WLP1 to WLP31, the insulation material for the word line WLP0 and the other word line WLP1 includes an oxide-based material such as $SiO_2$ whose dielectric constant is approximately 3.9. In addition to these mentioned insulation materials, another insulation material can be appropriately selected from a group consisting various materials listed in Table 1 below. Table 1 shows dielectric materials and their characteristics described in an article by G. D. Wilk et al., *Journal of Applied Physics*, Vol. 89(10), pp. 5243-5275, 2001.

TABLE 1

| Material | Dielectric Constant | Band Gap Energy (eV) | Crystal Structure(s) |
| --- | --- | --- | --- |
| $SiO_2$ | 3.9 | 8.9 | amorphous |
| $Si_3N_4$ | 7 | 5.1 | amorphous |
| $Al_2O_3$ | 9 | 8.7 | amorphous |
| $Y_2O_3$ | 15 | 5.6 | cubical |
| $La_2O_3$ | 30 | 4.3 | hexagonal, cubical |
| $Ta_2O_5$ | 26 | 4.5 | orthorhombic |
| $TiO_2$ | 80 | 3.5 | tetragonal (rutile, anatase) |
| $HfO_2$ | 25 | 5.7 | monoclinic, tetragonal, cubical |
| $ZrO_2$ | 25 | 7.8 | monoclinic, tetragonal, cubical |

In addition to the above listed dielectric materials, various other materials can be used as long as an inherent insulation characteristic can be secured. An important factor associated with the selection of the insulation material includes a relative dielectric constant difference between the insulation layer between the word line WLP0 and the other word line WLP1 and the insulation layers between the other word lines WLP1 and WLP31. In other words, any insulation material that cannot satisfy the dielectric constant difference should not be used. At this time, one consideration factor is that, if the selected insulation material has a high dielectric constant, the interference effect is likely to be pronounced. Thus, a threshold voltage of a memory cell is likely to increase to a great extent. For instance, the threshold voltage that is usually distributed within a range of approximately 2 V to 5 V increases to a voltage level greater than this ranged voltage level. Hence, an appropriate insulation material needs to be selected considering a device characteristic.

One exemplary insulation layer includes an oxide-based material selected alone or in combination from a group consisting of borophosphosilicate glass (BPSG), phosphosilicate glass (PSG), undoped silicate glass (USG), spin on glass (SOG), spin on dielectric (SOG), tetraethyl orthosilicate glass (TEOS), high density plasma (HDP) oxide. An organic photoresist material, an anti-reflective coating material, and an amorphous carbon material, which are used as an etch mask, can also be employed as the insulation material. A mixture layer containing those materials of Table 1 that are mixed in a certain ratio can also be employed as the insulation material. Examples of the mixture layer include $HfO_xAl_yO_z$, $ZrO_x$-$Al_yO_z$, and $LaO_xAl_yO_z$, where x, y and z are natural numbers each representing a compositional ratio of the mixture component. A low dielectric material whose dielectric constant is less than approximately 3 can also be used as the insulation material for spacers. Table 2 below shows exemplary low dielectric materials whose dielectric constant is less than approximately 3.

TABLE 2

| Deposition Type | Organic-Based Material | Inorganic-Based Material |
| --- | --- | --- |
| SOG | SiLK ™(Dow Chemical, k = 2.6) | FOx(Dow Chemical, HSSQ, k = 3.0) |
|  | BCB(Dow Chemical, k = 2.7) | HOSP(Honeywell, MSSQ, k = 2.6) |
|  | FLARE ™(Honeywell, k = 2.8) | JSR(LKD-T200, k = 2.6) |
| CVD | Parylene(k = 2.6) | Black Diamond(AMT, k = 2.7-3.0) |
|  | a-C:H(F)(k = 2.2-2.7) | CORAL(Novellus, k = 2.7-2.8) |

In the above Table 2, 'SiLK™, BCB, FLARE™, FOx, HOSP, and JSR represent the product names. Also, those acronyms 'SOG,' 'CVD,' 'HSSQ,' and 'MSSQ' stand for 'spin on glass,' 'chemical vapor deposition,' 'hydrogen silsesquioxane,' and 'methyl silsesquioxane,' respectively.

Figure 6A:
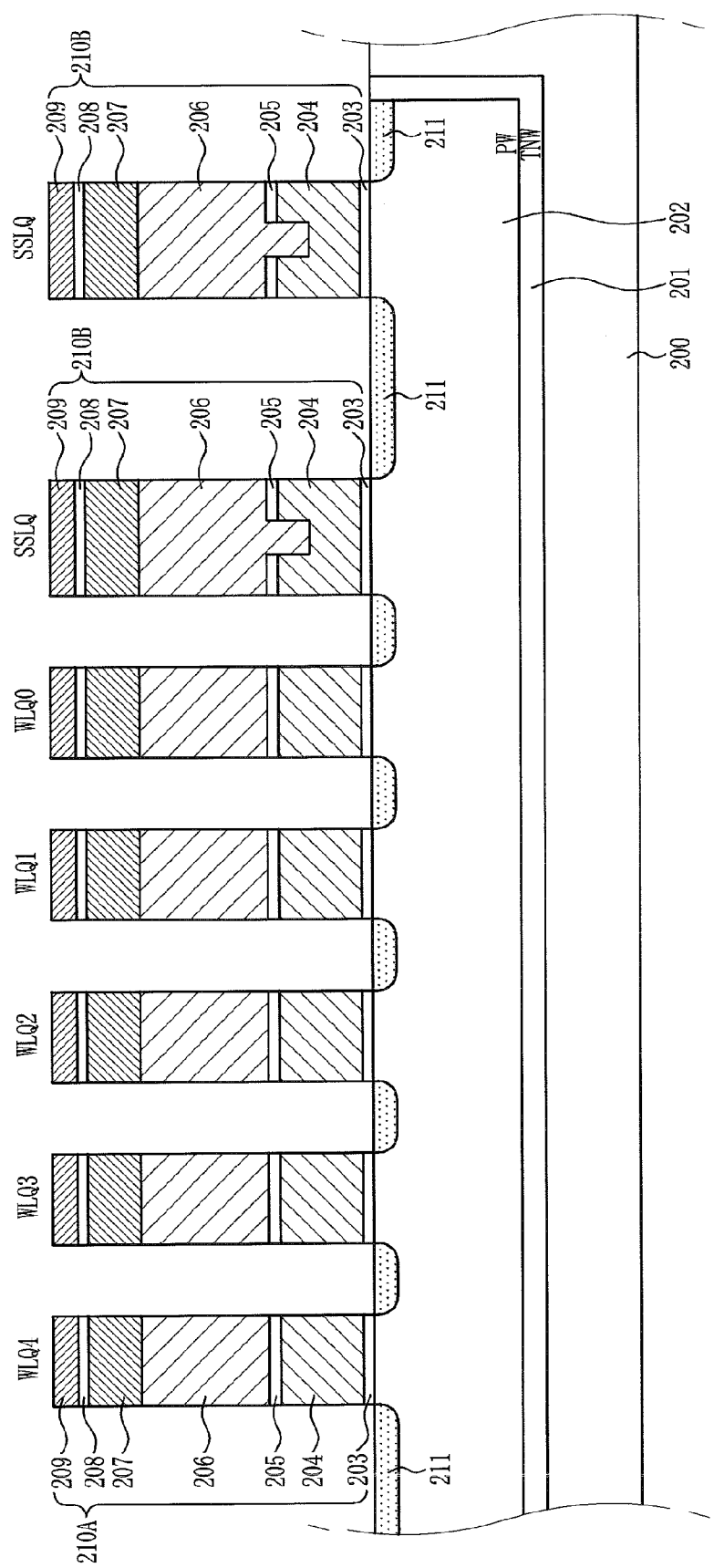
FIGS. 6A to 6D are cross-sectional views illustrating a method for fabricating a NAND flash memory device in accordance with another embodiment of the present invention.
Figure 6B:
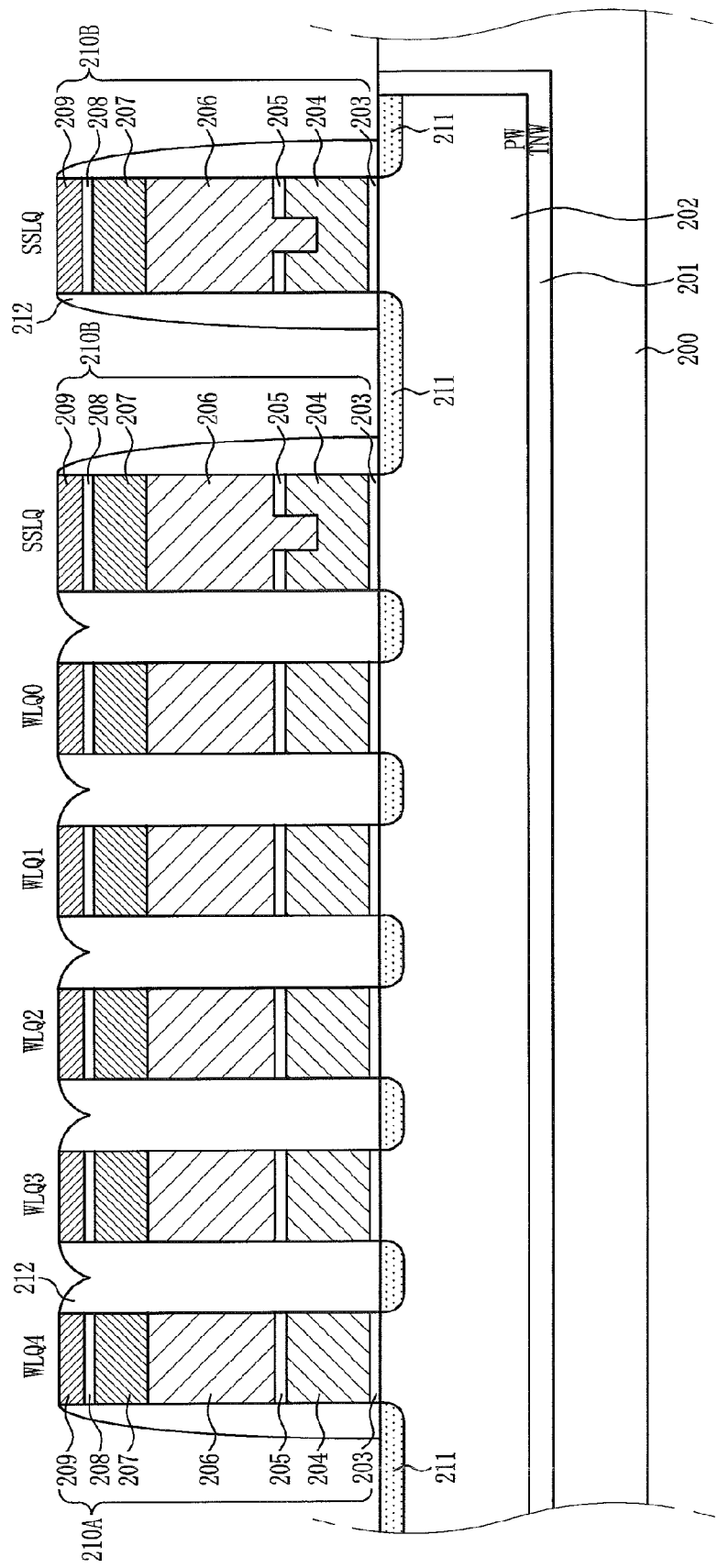
Figure 6C:
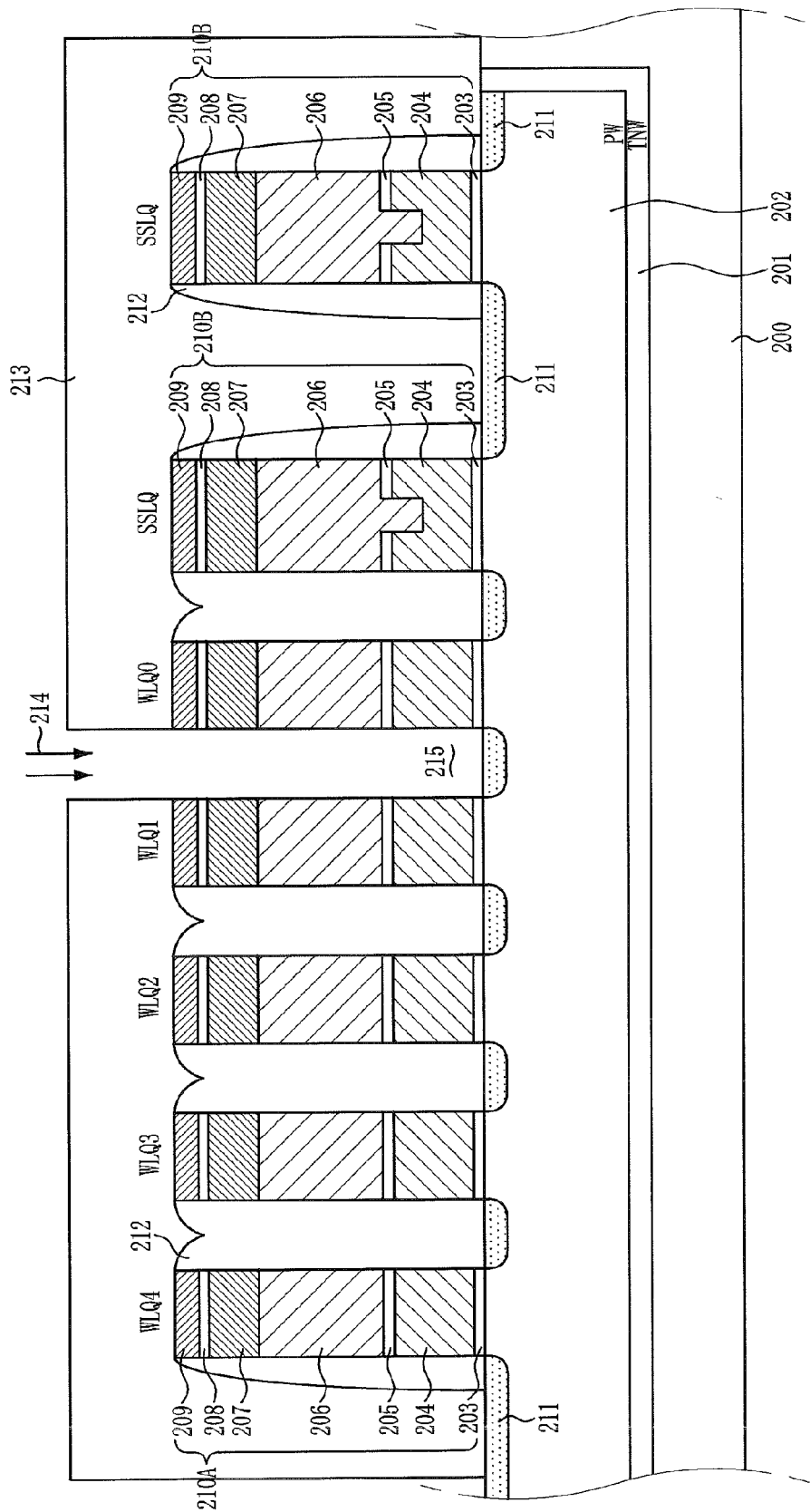
Figure 6D:
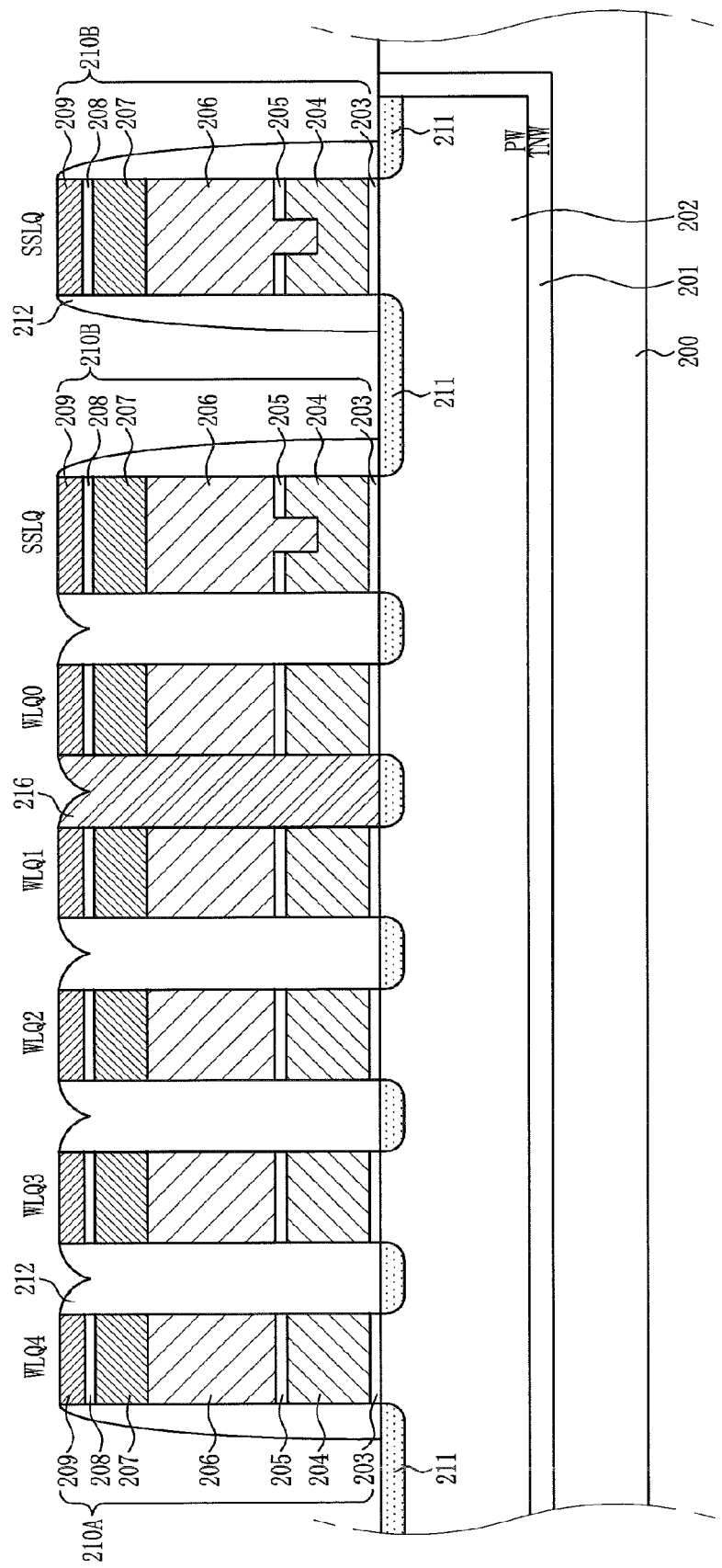

With reference to FIGS. 6A and 6D, a method for fabricating a NAND flash memory device according to a second embodiment of the present invention will be described. Referring to FIG. 6A, a triple N-type well labeled as TNW and 201 is formed in a P-type substrate 200, and a P-type well labeled as PW and 202 is formed inside the triple N-type well 201. An ion implantation process for adjusting a threshold voltage is performed.

First and second gate structures 210A and 210B are formed over the substrate 200 by performing a shallow trench isolation (STI), self-aligned STI, or advanced self-aligned (ASA)-STI process. Each of the first and second gate structures 210A and 210B includes a gate insulation layer 203, a floating gate 204, a dielectric layer 205, and a control gate 206.

In detail, each of the first gate structures 210A coupled to respective word lines WLQ0 to WLQ4, functioning as memory cells, is formed in a stack structure including the gate insulation layer 203, the floating gate 204, the dielectric layer 205, and the control gate 206. In an actual implementation, the first gate structures 210A are integrated with the respective word lines WLQ0 to WLQ4. On the other hand, each of the second gate structures 210B functioning as transistors including logic devices is formed in a stack structure as similar to the first gate structures 210A, or in a structure where the floating gate 204 and the control gate 206 are electrically shorted by which the dielectric layer 205 is penetrated. The gate insulation layer 203 can be formed in a single layer structure of an oxide-based material or in a double layer structure of an oxide-based material and a nitride-based material. The dielectric layer 205 can be formed in a stack structure of an oxide-based material, a nitride-based material and another oxide-based material. Alternatively, the dielectric layer 205 can be formed in a single layer structure including a material selected from a group consisting of those high dielectric materials listed in Table 1, or in a mixture or stack layer structure including those high dielectric materials selected from the group provided in Table 1. Also, the floating gate 204 and the control gate 206 each include polysilicon.

A metal layer 207 may be formed over the control gate 206 to reduce the contact resistance. The metal layer 207 can be formed in a stack structure including a transition metal-based layer, a rare earth metal-based layer, a mixture layer including the transition metal-based layer and the rare earth metal-based layer, a nitride-based layer, and a silicide-based layer. A buffer layer 208 for protecting the metal layer 207 and a hard mask 209 can also be formed over the metal layer 207. The buffer layer 208 and the hard mask 209 include an oxide-based material and a nitride-based material, respectively.

The first gate structures 110A illustrated in FIG. 5 and the first gate structures 210A illustrated in FIGS. 6A to 6D are formed with substantially the same width and space distance. However, as described above, one of the first gate structure 110A or 210A coupled to the word line WLP0 illustrated in FIG. 5 or the word line WLQ0 illustrated in FIGS. 6A to 6D is formed with the width and space distance larger than the width and space distance of the rest of the first gate structures 110A or 210A coupled to the other word lines WLP1 to WLP4 or WLQ1 to WLQ4 in order to improve program disturbance with the adjacent source selection line SSLP or SSLQ.

Although not illustrated, the word line WLP31 or WLQ31 coupled to a drain selection transistor is formed to have the line width substantially the same as the word line WLP0 or WLQ0. As a result, this approach to the line width allows the word line WLP31 or WLQ31 to be compensated for the interference effect, which causes an increase in the cell threshold voltage as the first programming operation is performed, but does not affect the word line WLP31 or WLQ31. In detail, the low threshold voltage of the word line WLP31 or WLQ31 (refer to FIG. 2 for the threshold voltage distribution) can be increased to voltage levels of threshold voltages of the memory cells coupled to the other word lines WLP1 to WLP30 or WLQ1 to WLQ30.

Junction regions 211 each functioning as source or drain regions are formed in portions of the substrate 200 exposed between the first and second gate structures 210A and 210B. The junction regions 211 can be formed in a lightly doped drain (LDD) structure to prevent a short channel effect.

Referring to FIG. 6B, an insulation layer for spacers is formed over a substrate structure where the first and second gate structures 210A and 210B are formed over the substrate 200. The insulation layer is etched back using a dry etching to form spacers 212 (hereinafter referred to as first spacers). The first spacers 212 include a nitride-based material.

Referring to FIG. 6C, a photoresist pattern 213 (i.e., etch mask) is formed through photolithography in a manner to open a region between the word line WLQ0 and the word line WLQ1. An etching process 214 is performed using the photoresist pattern 213 to remove a portion of the spacers 212 disposed between the word line WLQ0 and the word line WLQ1. As a result, as reference numeral 215 indicates, a portion of the substrate 200 disposed between the word line WLQ0 and the word line WLQ1 is exposed. The etching process 214 is performed to etch the spacers 212 within a range that allows the minimization of damage on the first gate structures 210A and the exposed portion of the substrate 200. For instance, a dry etching, more particularly, a plasma etching may be performed using a mixture gas of $CHF_3$ and $O_2$ gases, or $CH_2F_2$ gas, each having high etch selectivity to $SiO_2$ and silicon, as an etch gas. A wet etching may be performed using phosphoric acid.

Referring to FIG. 6D, another insulation layer for a spacer is formed over the exposed portion of the substrate 200 filling the space between the word line WLQ0 and the other word line WLQ1. The other insulation layer is etched back to form a second spacer 216 filling the space between the word line WLQ0 and the other word line WLQ1. The second spacer 216 includes an oxide-based material having a lower dielectric constant than a nitride-based material.

Figure 7:
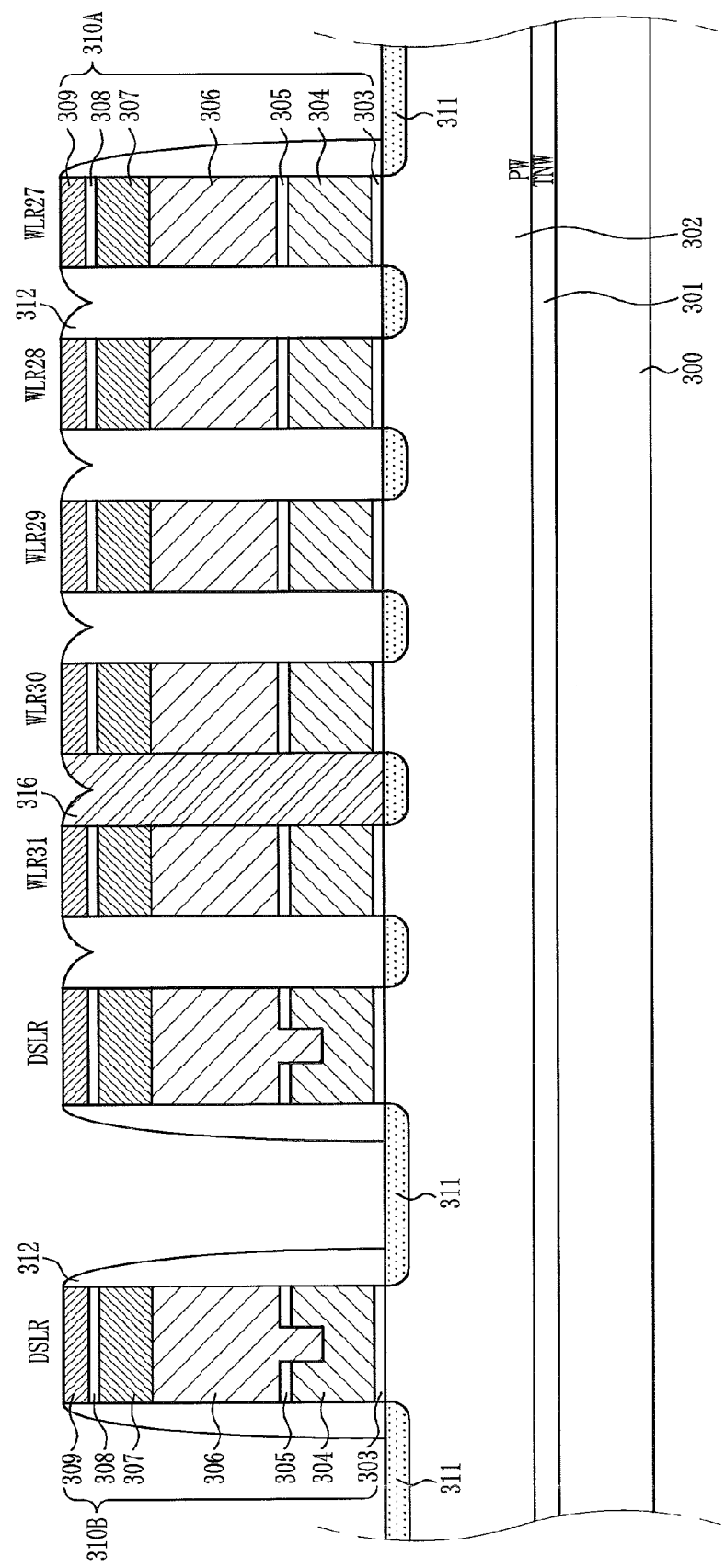
FIG. 7 illustrates a cross-sectional view of a NAND flash memory device in accordance with another embodiment of the present invention.

FIG. 7 illustrates a cross-sectional view of a NAND flash memory device in accordance with a third embodiment of the present invention. For simplicity of the description, 5 word lines WLR28 to WLR31 among various word lines, and a drain selection line DSLR are illustrated. Also, reference numerals 300, 301, and 302 represent a P-type substrate, a triple N-type well labeled as TNW, and a P-type well labeled as PW, respectively. Reference numerals 310A and 310B represent respective first and second gate structures, each including a gate insulation layer 303, a floating gate 304, a dielectric layer 305, and a control gate 306. Reference numerals 307, 308, and 309 represent a metal layer, a buffer layer for protecting the metal layer 307 and a hard mask, respectively. Reference numeral 311 represents a junctions region functioning as a source or drain region. Since the aforementioned elements are substantially the same as or similar to those elements described in detail in FIGS. 6A to 6D, detailed description thereof will be omitted.

Contrary to the first and second embodiments of the present invention, a memory cell array structure for the programming operation performed from the word line WLR0 to the word line WLR31 is suggested in the third embodiment of the present invention. In such a case, the memory cells show a cell threshold voltage distribution different from the one illustrated in FIG. 2. In other words, the memory cell coupled to the word line WLR0 has the lowest threshold voltage, while the memory cell coupled to the word line WLR31 has the highest threshold voltage.

In the NAND flash memory device according to the third embodiment of the present invention, an insulation layer filling the space between the two word lines WLR30 and WLR31 includes a material that has different dielectric constant from a material for insulation layers filling the spaces between the other word lines WLR0 to WLR30. In particular, the insulation material filling the space between the two word lines WLR30 and WLR31 has a lower dielectric constant than the insulation material filling the spaces between the other word lines WLR0 to WLR30. The line width of the word line WLR31 is larger than the line widths of the other word lines WLR0 to WLR30.

In the case where the insulation layer filling the space between the word line WLR30 and the word line WLR31 includes a material having a lower dielectric constant than a material for the insulation layers filling the spaces between the other word lines WLR0 to WLR30, the capacitance generated by the insulation layer between the word line WLR30 and the word line WLR31 is reduced to be less than the capacitance generated by the insulation layers between the other word lines WLR0 to WLR30. The capacitance reduction allows attenuation of the interference effect on the region where the two word lines WLR30 and WLR31 exist in comparison to the region where the other word lines WLR0 to WLR30 exist, so that the threshold voltage of the memory cell coupled to the word line WLR31 can be reduced.

Figure 8:
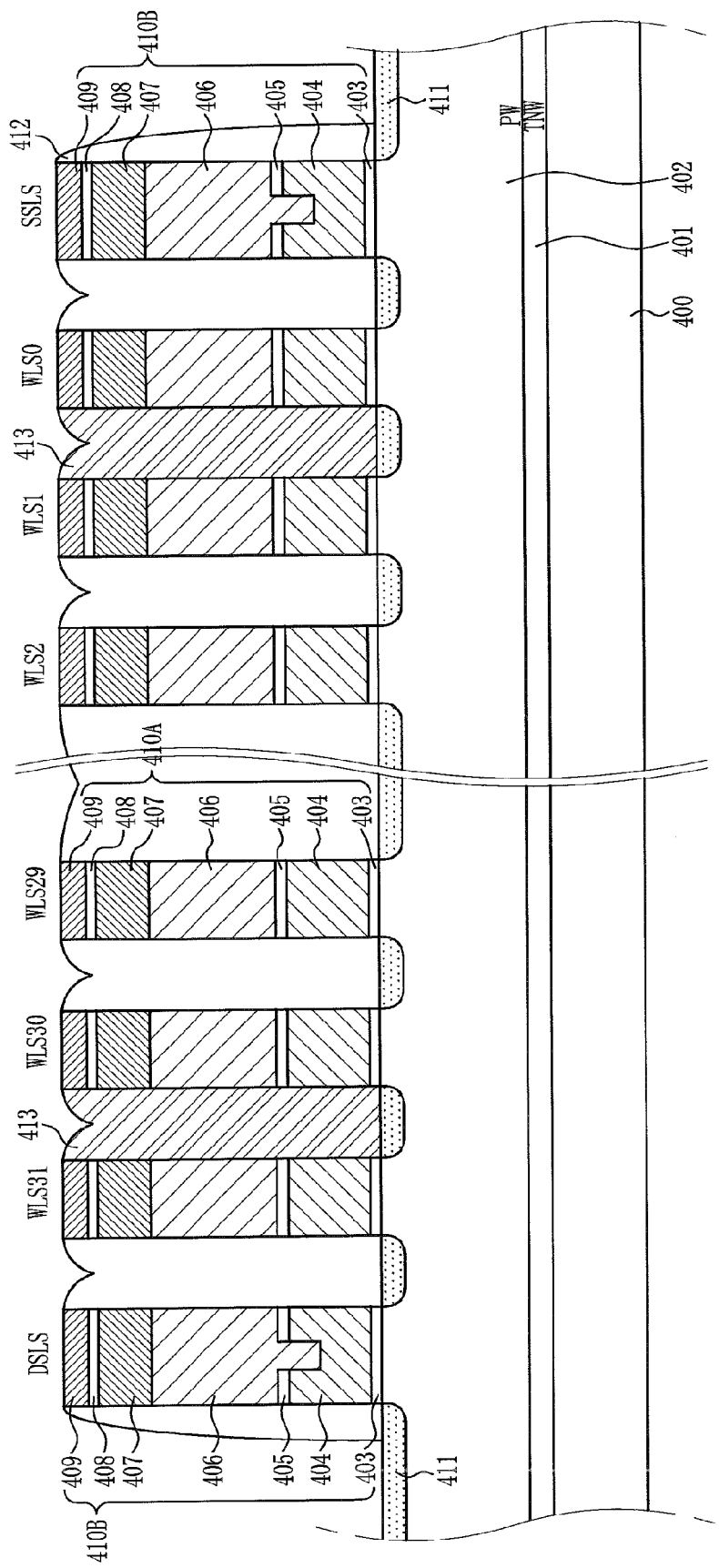
FIG. 8 illustrates a cross-sectional view of a NAND flash memory device in accordance with yet another embodiment of the present invention.

FIG. 8 illustrates a cross-sectional view of a NAND flash memory device in accordance with a fourth embodiment of the present invention. In the fourth embodiment, a memory cell array structure that can correspond to any case where a sequential programming operation starts from a word line WLS0 or WLS31 is suggested. In other words, the fourth embodiment is the combination of the first and third embodiments. According to the fourth embodiment, the memory cell array structure is suggested to reduce a threshold voltage of a memory cell coupled to the word line WLS0 to a voltage level of substantially the same as those of threshold voltages of memory cells coupled to respective word lines WLS0 to WLS30 if the sequential programming operation starts from the word line WLS31 as the first embodiment, and to reduce a threshold voltage of a memory cell coupled to the word line WLS31 to a voltage level substantially the same as those of threshold voltages of memory cells coupled to respective word lines WLS0 to WLS30 if the sequential programming operation starts from the word line WLS0 as like the third embodiment.

In the NAND flash memory device according to the fourth embodiment as illustrated in FIG. 8, an insulation layer 413 (hereinafter referred to as a first insulation layer) fills the space between the word line WLS0 and the word line WLS1, and the space between the word line WLS30 and the word line WLS31. More specifically, these mentioned spaces are filled with substantially the same insulation material. Another insulation layer 412 (hereinafter referred to as a second insulation layer) fills the spaces between other word lines WLS1 and WLS30. The second insulation layer 312 includes a material having a higher dielectric constant than the material for the first insulation layer 313. This differentiation in insulation materials with different dielectric constants makes it possible to maintain the consistency in the threshold voltages of the memory cells coupled to the respective word lines WLS0 to WLS31 within the same string regardless of the word line from which the sequential programming operation starts first.

Also, reference numerals 400, 401, and 402 represent a P-type substrate, a triple N-type well labeled as TNW, and a P-type well labeled as PW, respectively. Reference numerals 410A and 410B represent respective first and second gate structures, each including a gate insulation layer 403, a floating gate 404, a dielectric layer 405, and a control gate 406. Reference numerals 407, 408, and 409 represent a metal layer, a buffer layer for protecting the metal layer 407 and a hard mask, respectively. Reference numeral 411 represents a junctions region functioning as a source or drain region. Also, reference denotations DSLS and SSLS represent a drain selection line and a source selection line, respectively. Since these briefly mentioned elements are substantially the same as or similar to those elements described in detail in FIGS. 6A to 6D, detailed description thereof will be omitted.

According to various embodiments of the present invention, insulation layers formed between individual word lines within the same string include materials having different dielectric constants. As a result, threshold voltages of memory cells coupled to the word lines can be maintained consistent within the same string. This effect allows an improvement on reliability of devices.

While the present invention has been described with respect to various embodiments, it will be apparent to those skilled in the art that various changes and modifications may be made without departing from the spirit and scope of the invention as defined in the following claims. The embodiments of the present invention should not be construed as being limitive, rather being illustrative to enhance better understanding of the scope and spirit of the present invention. In particular, although NAND flash memory devices are exemplarily described in the embodiments of the present invention, the present invention can be implemented in any non-volatile memory device with a memory cell array structure that is configured in a string structure.

What is claimed is:

1. A non-volatile memory device comprising:
    a plurality of memory cells coupled in series;
    a plurality of word lines coupled to the respective memory cells; and
    a plurality of spacers interposed between the word lines and having different dielectric constants according to line widths of the word lines.

2. The non-volatile memory device of claim 1, wherein the spacer interposed between the word lines at least one of which has a larger line width than the other word lines includes a material having a lower dielectric constant than a material for the spacers interposed between the other word lines.

3. The non-volatile memory device of claim 2, further comprising:
    a drain selection line; and
    a source selection line;
    wherein
    said word lines are sequentially disposed between said drain selection line and said source selection line to define a unit string;
    the word line having the larger line width is immediately adjacent to the source selection line and is adapted to be subjected to a last programming operation of a sequential programming operation.

4. The non-volatile memory device of claim 2, wherein a spacing between the word line having the larger line width and the neighboring word line is different from spacings between the other word lines.

5. The non-volatile memory device of claim 1, further comprising:
    a drain selection line; and
    a source selection line;
    wherein
    said word lines are sequentially disposed between said drain selection line and said source selection line to define a unit string;
    one of the world lines is immediately adjacent to one of the drain selection line and said source selection line and has a larger line width than the other word lines;
    the spacer interposed between the word line having the larger line width and the neighboring word line (i) includes a material having a lower dielectric constant than a material of the spacers interposed between the other word lines and (ii) defines a spacing between the word line having the larger line width and the neighboring word line to be greater than spacings between the other word lines; and
    the lower dielectric constant and greater spacing of said spacer together define for the memory cells coupled to the word line having the larger line width a substantially same threshold voltage as that of the memory cells coupled to the other word lines.

6. A non-volatile memory device comprising:
    a bit line;
    a common source line;
    a first selection transistor coupled to the bit line;
    a second selection transistor coupled to the common source line;
    a plurality of memory cells coupled in series between the first selection transistor and the second selection transistor;
    a plurality of word lines coupled to the respective memory cells; and
    a plurality of spacers interposed between the word lines and having different dielectric constants according to line widths of the word lines.

7. The non-volatile memory device of claim 6, wherein the spacer interposed between the word lines at least one of which has a larger line width than the other word lines includes a material having a lower dielectric constant than a material for the spacers interposed between the other word lines.

8. The non-volatile memory device of claim 7, wherein the word line having the larger line width is adapted to be subjected to a last programming operation of a sequential programming operation.

9. The non-volatile memory device of claim 7, wherein a spacing between the word line having the larger line width and the neighboring word line is different from spacings between the other word lines.

10. The non-volatile memory device of claim 6, wherein one of the word lines is coupled to the second selection transistor and has a line width larger than the other world lines.

11. The non-volatile memory device of claim 10, wherein the spacer interposed between the word line coupled to the second selection transistor and the neighboring word line has a dielectric constant lower than the spacers interposed between the other word lines.

12. The non-volatile memory device of claim 11, wherein another one of the word lines is coupled to the first selection transistor and adapted to be subjected to an initial programming operation of a sequential programming operation.

13. The non-volatile memory device of claim 6, wherein one of the word lines is coupled to the first selection transistor and has a line width larger than the other word lines.

14. The non-volatile memory device of claim 13, wherein the spacer interposed between the word line coupled to the first selection transistor and the neighboring word line includes a material having a dielectric constant lower than a material for the spacers interposed between the other word lines.

15. The non-volatile memory device of claim 14, wherein another one of the word lines is coupled to the second selection transistor and adapted to be subjected to an initial programming operation of a sequential programming operation.

16. The non-volatile memory device of claim 6, wherein the spacers fill the spaces between the word lines, and the first and second selection transistors comprise a drain selection transistor and a source selection transistor, respectively.

17. A method for fabricating a non-volatile memory device, wherein the non-volatile memory device is configured in a unit string including first and second selection transistors, and a plurality of memory cells coupled in series between the first and second selection transistors, the method comprising:
- forming the first and second selection transistors and the memory cells over a substrate;
- forming first spacers to fill spaces between the memory cells;
- removing one of the first spacers formed between the memory cell coupled to one of the first and second selection transistors and the neighboring memory cell; and
- forming a second spacer to fill a space that is left between the memory cell coupled to said one of the first and second selection transistors and the neighboring memory cell by the removal of said one of the first spacers, the second spacer comprising a material having a lower dielectric constant than a material for the first spacers.

18. The method of claim 17, wherein the memory cell coupled to said one of the first and second selection transistors is formed to have a line width larger than the other memory cells.

19. The method of claim 18, wherein the first spacers include a nitride-based material.

20. The method of claim 19, wherein the second spacer includes an oxide-based material.

21. The method of claim 20, wherein a spacing between the memory cell coupled to said one of the first and second selection transistors and the neighboring memory cell is greater than spacings between the other memory cells.

22. The non-volatile memory device of claim 6, wherein
- each of said memory cells and selection transistors comprises a control gate, a floating gate, and a dielectric layer between the control gate and the floating gate; and
- the dielectric layer in each said memory cell completely insulates the respective control gate and floating gate from each other, whereas the dielectric layer in each said selection transistor does not completely insulate the respective control gate and floating gate from each other and allows the respective control gate and floating gate of the selection transistor to be electrically connected to each other.

* * * * *